United States Patent [19]
Bhatia

[11] Patent Number: 6,111,748
[45] Date of Patent: Aug. 29, 2000

[54] FLAT FAN HEAT EXCHANGER AND USE THEREOF IN A COMPUTING DEVICE

[75] Inventor: Rakesh Bhatia, San Jose, Calif.

[73] Assignee: Intel Corporation, Santa Clara, Calif.

[21] Appl. No.: 08/857,710

[22] Filed: May 15, 1997

[51] Int. Cl.[7] .................................................. H05K 7/20
[52] U.S. Cl. ...................... 361/695; 361/700; 165/80.7; 165/122; 415/177
[58] Field of Search .................................. 165/80.3, 121, 165/122, 126, 185, 104.33; 361/687, 704, 694–697, 700–703; 415/177, 178

[56] References Cited

U.S. PATENT DOCUMENTS

| | | | |
|---|---|---|---|
| 3,592,260 | 7/1971 | Berger | 361/696 |
| 4,449,576 | 5/1984 | Baum et al. | 165/104.33 |
| 5,159,972 | 11/1992 | Gunnerson et al. | 165/32 |
| 5,195,576 | 3/1993 | Hatada et al. | 165/80.3 |
| 5,198,889 | 3/1993 | Hisano et al. | 257/678 |
| 5,255,109 | 10/1993 | Klein | 359/43 |
| 5,313,362 | 5/1994 | Hatada et al. | 361/709 |
| 5,361,188 | 11/1994 | Kondou et al. | 361/695 |
| 5,402,312 | 3/1995 | Kinjo et al. | 361/695 |
| 5,409,055 | 4/1995 | Tanaka et al. | 165/104.33 |
| 5,414,591 | 5/1995 | Kimura et al. | 361/695 |
| 5,424,913 | 6/1995 | Swindler | 361/687 |
| 5,427,502 | 6/1995 | Hudson | 415/211.1 |
| 5,430,609 | 7/1995 | Kikinis | 361/687 |
| 5,441,576 | 8/1995 | Bierschenk et al. | 136/203 |
| 5,458,189 | 10/1995 | Larson et al. | 164/104.33 |
| 5,475,563 | 12/1995 | Donahoe et al. | 361/695 |
| 5,502,618 | 3/1996 | Chiou | 361/695 |
| 5,513,070 | 4/1996 | Xie et al. | 361/700 |
| 5,522,712 | 6/1996 | Winn | 417/436 |
| 5,550,710 | 8/1996 | Rahamin et al. | 361/687 |
| 5,559,675 | 9/1996 | Hsieh et al. | 361/707 |
| 5,583,316 | 12/1996 | Kitahara et al. | 174/16.3 |
| 5,588,483 | 12/1996 | Ishida | 165/86 |
| 5,598,320 | 1/1997 | Toedtman et al. | 361/687 |
| 5,621,613 | 4/1997 | Haley et al. | 361/687 |
| 5,646,822 | 7/1997 | Bhatia et al. | 361/687 |
| 5,646,824 | 7/1997 | Ohashi et al. | 361/699 |
| 5,694,294 | 12/1997 | Ohashi et al. | 361/695 |
| 5,757,619 | 5/1998 | Imai et al. | 361/697 |
| 5,810,608 | 9/1998 | MacGregor et al. | 361/695 |
| 5,816,319 | 10/1998 | Kamekawa et al. | 361/697 |
| 5,838,066 | 11/1998 | Kitajo | 361/697 |
| 5,898,569 | 4/1999 | Bhatia | 361/700 |
| 5,966,286 | 10/1999 | O'Connor et al. | 361/687 |

FOREIGN PATENT DOCUMENTS

| | | | |
|---|---|---|---|
| 5259673 | 10/1993 | Japan | 361/697 |
| 6077677 | 3/1994 | Japan | 361/697 |

OTHER PUBLICATIONS

IBM Technical Disclosure Bulletin, vol. 22, No. 8A, Jan. 1980, 1 p.

*Primary Examiner*—Gregory Thompson
*Attorney, Agent, or Firm*—Jeffrey S. Draeger

[57] ABSTRACT

A fan heat exchanger. The heat exchanger includes a fan housing which defines a chamber as well as top and bottom closing surfaces for the chamber. A fan is mounted in the chamber and has a rotational axis substantially perpendicular to the bottom surface.

11 Claims, 5 Drawing Sheets

FLAT FAN HEAT EXCHANGER AND USE THEREOF IN A COMPUTING DEVICE

FIELD OF THE INVENTION

The present invention pertains to the field of heat removal from electronic components. More particularly, this invention relates to heat removal from a computing device using a fan.

BACKGROUND

Faster and more powerful computer components allow the design and construction of higher performance portable computing devices such as laptop or notebook computers. Unfortunately, the use of such faster and more powerful computer components often results in increased heat generation by such computing devices. Thus, improved heat dissipation technology is often needed to maintain operating temperatures of portable computing devices within the same range as their predecessors or some other acceptable range.

A portable computing device typically includes a base and a screen which are rotatably attached by a hinge. The base usually has an input device such as a keyboard or a touchpad as well as a number of electronic components. Integrated circuits with the highest clock frequency are typically located in close proximity to each other within the computer base.

Many heat generating computer system components take the form of integrated circuits. Such integrated circuits are typically mounted on a motherboard or another circuit board within the base of the portable computer device. A processor is one component that generates a large amount of heat in a typical computing device. Other electrical components which also generate heat include memory circuits, power supply circuits, and circuit boards such as a video card.

Maintaining operating temperatures of computer system components below certain levels is important to ensure performance, reliability, and safety. Most integrated circuits have specified maximum operating temperatures, above which the manufacturer does not recommend operation. Transistors, the building blocks of integrated circuits, tend to slow down as operating temperature increases. Thus, a computer system that operates its integrated circuits close to or beyond recommended timings may fail as temperature increases.

Additionally, integrated circuits may be physically damaged if temperatures elevate beyond those recommended. Such physical damage obviously can impact system reliability. Finally, the computer system casing should be kept at a temperature which is safe for human contact. This may necessitate spreading of heat throughout a computer system base or efficiently expelling heat to avoid hot spots near certain components such as a processor.

Typically, heat sinks, fans, and heat pipes are employed to dissipate heat from integrated circuits and other electronic components. Increases in heat generation are often accommodated by simply increasing the quantity or size of these heat dissipation elements. The relatively small size of a portable computing device, however, complicates heat dissipation by limiting airflow, crowding heat generating components, and reducing the space available for heat dissipation devices.

The small size of a portable computing device particularly restricts the use of cooling fans. As is illustrated in FIG. 1, a prior art cooling fan 150 is typically vertically mounted at an external surface of a portable computing device 105. As illustrated, the fan 150 is mounted in the plane of a side wall 120. This mounting plane is perpendicular to the axis of rotation of a shaft in the motor 160 and the fan blade 155 attached thereto. Air flows perpendicular to the axis of the mounting plane (i.e., parallel to the axis of rotation of the motor shaft and blade).

A side wall 120 of the base of the portable computing device is typically used since the lower surface of the device may be blocked by the surface upon which the device is resting and the upper surface typically houses a keyboard and may be blocked by the display (when the device is closed) or other objects resting on the device. The side or back of a computing device normally remains unobstructed during operation of the device and is accordingly a better candidate for fan mounting.

Since the form factor (the height of the side wall 120) of portable computing devices has become quite small and continues to decrease, vertically mounted side wall fans become less effective since their size must be decreased and the motor 160 (unless also shrunk) becomes a larger percentage of the fan area. Generally, such smaller fans are less powerful, have smaller blades, and are generally less effective at cooling the portable computing device.

Thus, the prior art fan cooling arrangements generally provide decreasing cooling capabilities as form factors decrease. Unfortunately, as electronic components use increasing amounts of power, increasing rather than decreasing cooling capabilities are needed to maintain components within a specified range of operating temperatures.

SUMMARY

A fan heat exchanger is described. The heat exchanger includes a fan housing which defines a chamber. The heat exchanger also includes top and bottom closing surfaces for the chamber. A fan is horizontally mounted in the chamber and has a rotational axis substantially perpendicular to the bottom surface.

BRIEF DESCRIPTION OF THE FIGURES

The present invention is illustrated by way of example and not limitation in the figures of the accompanying drawings.

DETAILED DESCRIPTION

The present invention provides a heat exchanger for a computing device. In the following description, numerous specific details such as component types, component sizes, and heat dissipation component locations, are set forth in order to provide a more thorough understanding of the present invention. It will be appreciated, however, by one skilled in the art that the invention may be practiced without such specific details.

The present invention provides numerous techniques for removing heat from a portable computing device through a flat fan heat exchanger arrangement. With the ability to remove additional heat, it may become possible to use higher power components or to operate components such as a processor in a portable computing device at a higher power level by either increasing the supplied voltage, reducing clock throttling, or increasing the operating frequency of the processor. As a result, a portable computing device may be able to obtain higher performance.

Figure 2:
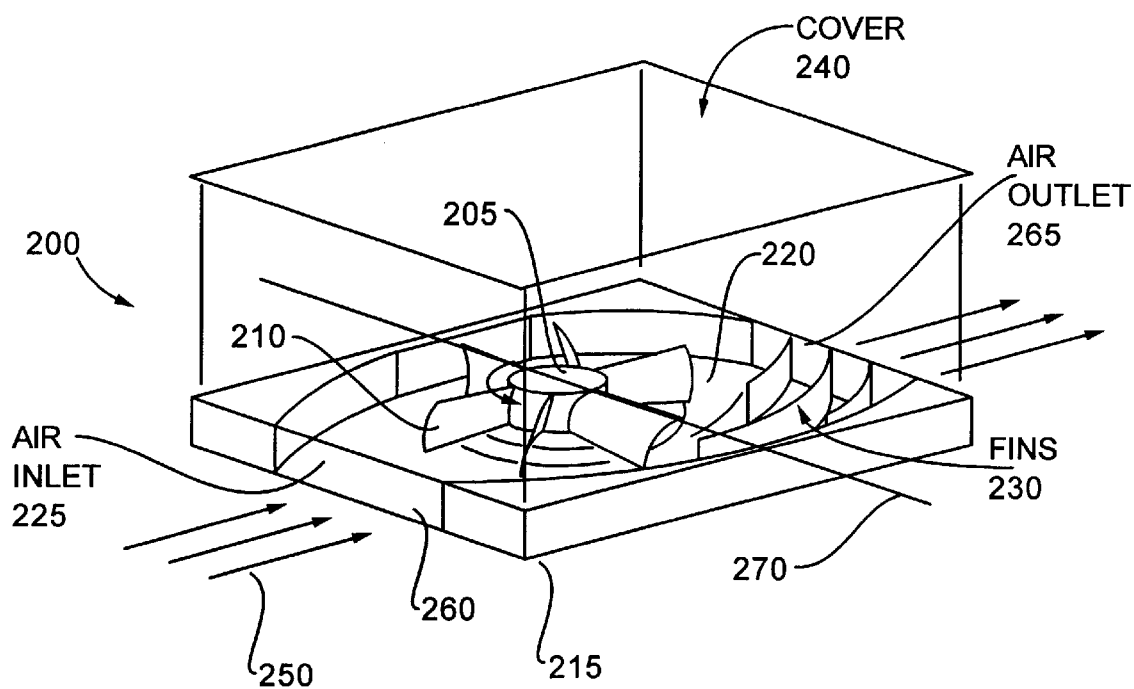
FIG. 2 illustrates one embodiment of a heat exchanger having a horizontally mounted fan.

FIG. 2 illustrates one embodiment of a flat fan heat exchanger 200 of the present invention. A fan housing 215, which may be metal, plastic, or any other suitable material, forms a chamber 220 in which the fan is horizontally mounted. The fan includes a motor 205 and a plurality of blades 210. The chamber 220 is bounded by a bottom surface 260 and a cover 240. In some embodiments, the bottom surface 260 and the cover 240 may be formed as a part of the fan housing 215. In alternate embodiments, the closing surfaces may be separate parts or may be formed by devices to which the fan is attached, such as a bottom and/or top housing of a portable computing device. Additionally, in other embodiments, the top and bottom closing surfaces may not fully seal the chamber, but rather may allow some airflow through one or both of the surfaces.

The fan is horizontally mounted, meaning that the axis of rotation of the blades (and likewise the motor in this embodiment) is substantially perpendicular to the top and bottom surfaces. In some embodiments, the top and/or bottom surface may be canted or otherwise uneven, making the rotational axis slightly varied from perpendicular to the top and/or bottom surface(s).

Having top and bottom surfaces closing the chamber and a horizontally mounted fan, the flat fan forces air in an airflow plane perpendicular to the axis of rotation of the fan. The airflow plane is substantially parallel to the planes defined by the cover 240 and the bottom surface 260, unless these surfaces are uneven or non-parallel. In either case, the airflow may also be non-uniform and not entirely planar; however, the majority of air flows from an inlet 225 to an outlet 265 on the opposite side of the fan housing 215, thus being generally planar and generally perpendicular to the axis of rotation of the fan.

Figure 1:
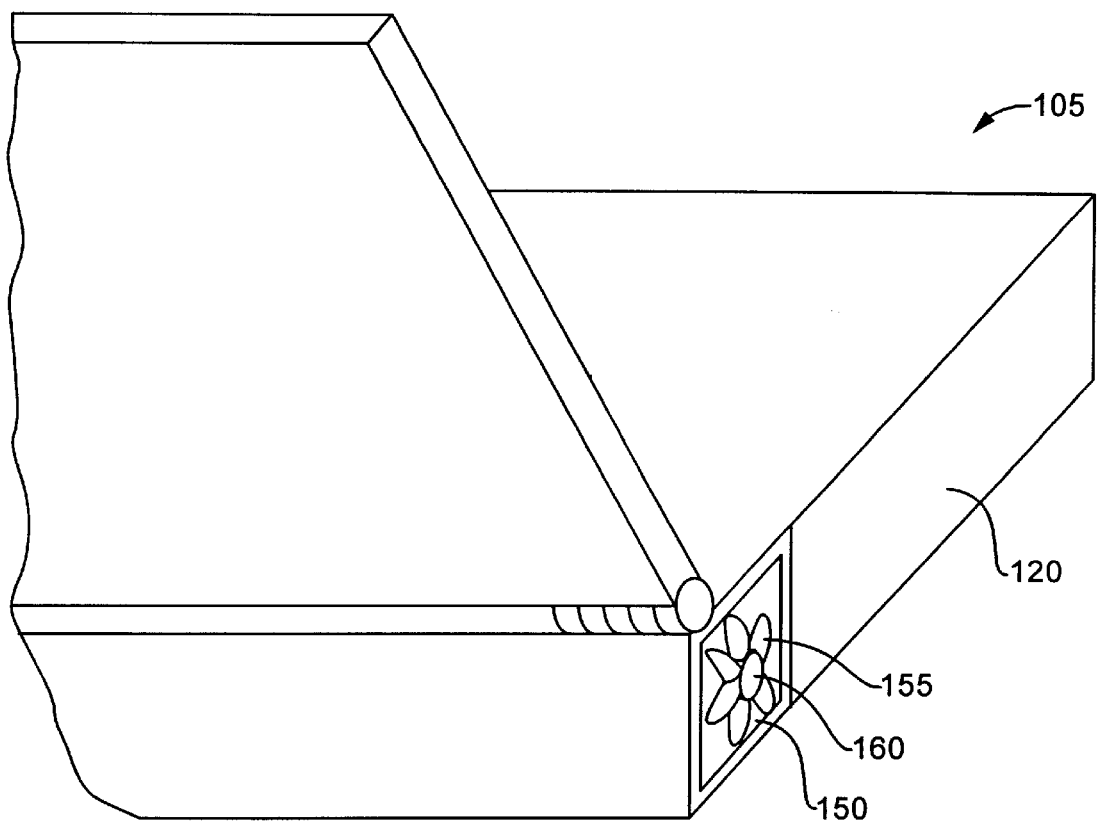
FIG. 1 illustrates a prior art vertically mounted fan being used to cool a computing device.

Airflow in a plane substantially perpendicular to the rotational axis of the blades distinguishes this arrangement from prior art fans, such as that shown in FIG. 1, which blow air substantially parallel to rotational axis. The inlet 225 and the outlet 265 are likewise different from such prior art arrangements as they are substantially parallel to the axis of rotation and perpendicular to the airflow plane.

An illustrated airflow axis 250 is formed along a line passing through the inlet 225 and the outlet 265. The motor 205 is mounted along a perpendicular axis 270 which is perpendicular to the airflow axis 250. The motor 205 is offset from the center of the chamber 220 along the perpendicular axis 270 to improve the horizontal airflow. Additionally, a set of fins 230 are included to channel air through the air outlet 265. The motor rotates in a counterclockwise direction when viewed from the top with the air inlet 225 on the left. Thus, air is pulled from the narrower portion of the chamber at the inlet 225 to the broader section at the outlet 265.

In order to propel air in the horizontal plane, the fan blades may be formed to scoop air through the horizontal plane. Traditional fan blades typically have a substantially vertical mounting at their axis and twist in a shape which propels air substantially parallel to their rotational axis. Blades for a horizontally mounted fan may be better optimized to increase horizontal air flow by using blades which twist less from their vertical axial mounting towards a horizontally oriented tip than in a traditional vertically mounted fan. Alternately, any surface which propels air suitably for horizontal fan mounting may be used.

The housing 215 may also be specially designed for the flat fan heat exchanger. As illustrated, rounded inner corners may be used to channel the air in the proper direction. Curving of the corner nearest the inlet and the side towards which the fan is offset may reduce air backflow through the inlet. The fins 230 also assist in channeling the air properly.

Figure 3:
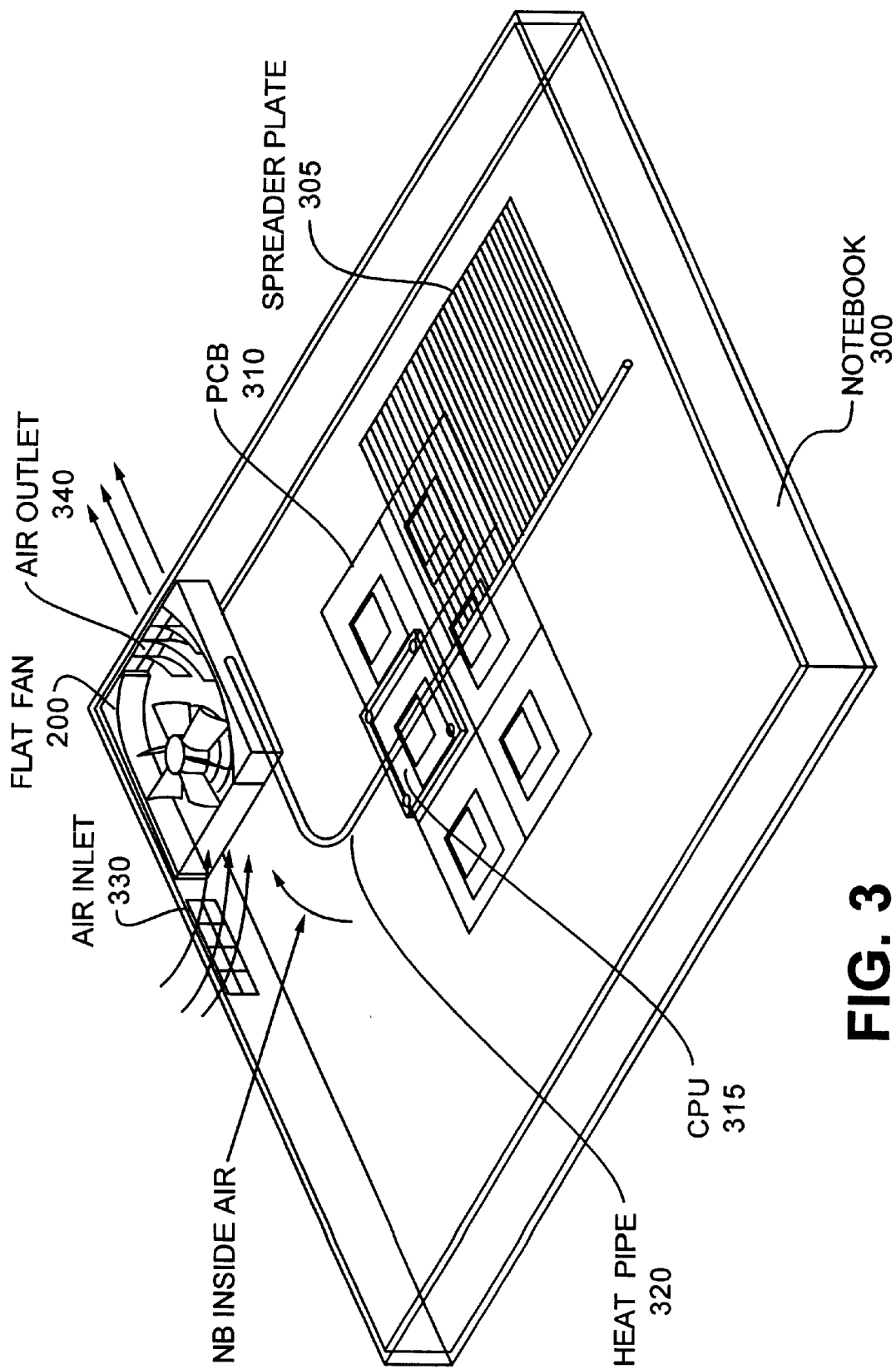
FIG. 3 illustrates one embodiment of a computing device which includes the heat exchanger 200 from FIG. 2.

FIG. 3 illustrates one embodiment of the present invention as used to cool a computing device such as a notebook computer 300. FIG. 3 illustrates only a base portion of the notebook computer 300; however, a hingedly attached display is usually included. In alternate embodiments, the portable computing device may be any other computing device which may benefit from cooling.

As illustrated, the notebook computer 300 includes a printed circuit board (PCB) 310 which has attached thereto a plurality of components including a processor or central processing unit (CPU) 315. In this embodiment, the CPU 315 is shown being cooled; however, in alternate embodiments many other electronic components or other portions of the computing device may be cooled. In a typical laptop or notebook computer, many other components are present. A memory system, a disk and/or CD ROM drive, audio and video hardware, connectivity (i.e., network and modem) hardware, as well as a power supply may all be present. These or other individual components as well as circuit boards or regional heat sinks within a computing device may be cooled according to the present invention.

In the illustrated embodiment, a heat pipe 320 has a first portion thermally coupled to the CPU 315. The heat pipe 320 has a bend and a second portion thermally coupled to the flat fan heat exchanger 200. Additionally, a third portion of the heat pipe 320 is thermally coupled to a heat spreader plate 305 which is typically affixed at least partially below a keyboard of the notebook computer 300. Each of these connections may be made using a thermal epoxy, solder, thermal tape or other known thermal connection techniques, combinations thereof, and/or combinations with known mechanical fasteners such as bolts or the like.

The illustrated embodiment includes an air inlet 330 on a first side of the notebook computer 300 and an air outlet 340 on a second side (e.g., the back) of the notebook computing device. The flat fan heat exchanger 200 draws in air from the inlet 330 and/or from within the housing of the notebook computer 300. This typically increases airflow over the CPU 315 and other components, thus supplementing the cooling that results from direct connection from the CPU 315 to the heat exchanger 200 via the heat pipe 320.

Figure 4A:
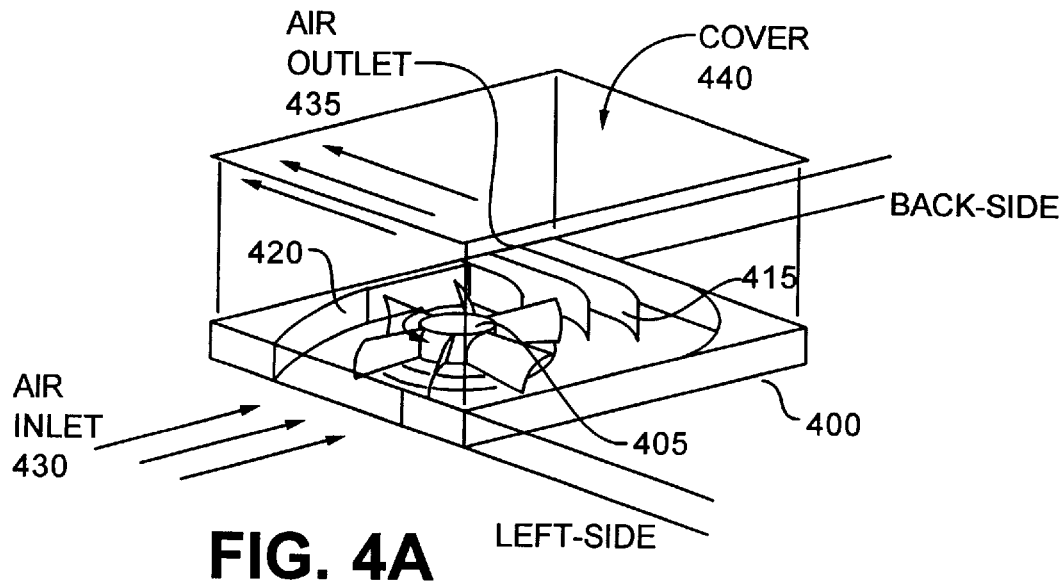
FIGS. 4a–4c illustrate another embodiment of a heat exchange device of the present invention.
Figure 4B:
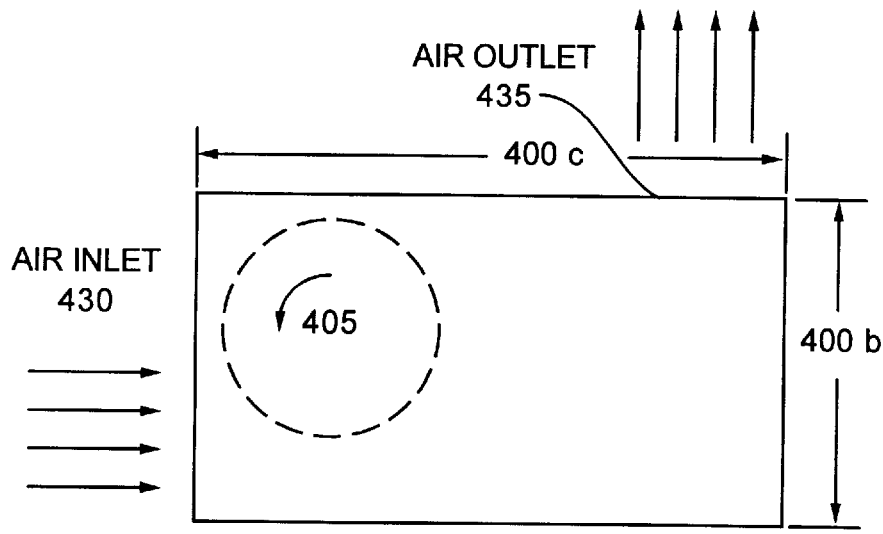
Figure 4C:
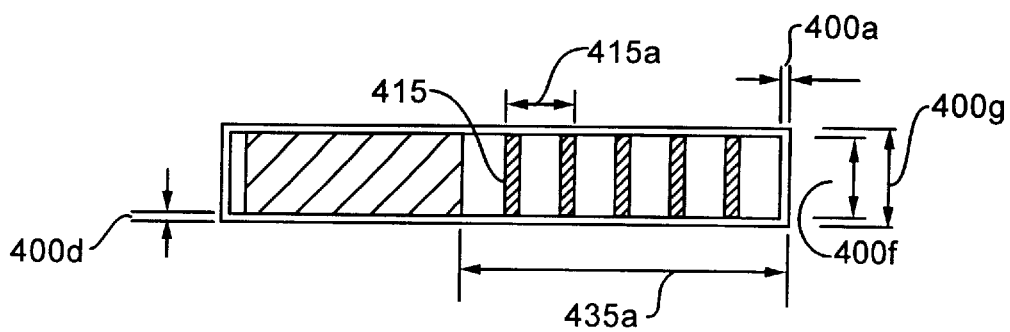

FIGS. 4a–4c illustrate several views of one embodiment of a flat fan heat exchanger. Again, the fan 405 is horizontally mounted and offset from the center of a chamber 420 formed by the fan housing 400. The fan 405 is placed close to a chamber side wall as is seen more clearly from the top view in FIG. 4b. In this embodiment, an air inlet 430 and an air outlet 435 are formed in adjacent rather than opposite sides of the housing 400.

Again, curved chamber walls as well as a set of fins 415 may be used to facilitate airflow from the inlet 430 to the outlet 435. The fins run substantially parallel to the inlet plane, although such fins typically are also curved to align with airflow from the fan blades. The fin length may vary depending on the radial distance from the center of the fan, with the outer fins being longer than the inner fans. Airflow remains substantially perpendicular to the axis of rotation of the fan blades; however, the inlet plane and the outlet plane form approximately a ninety degree angle.

As illustrated, the air inlet 430 is on the left side of the computing device and the outlet is at the rear. In alternate embodiments, the fan may be repositioned in any corner, and the inlet and outlet and fan configuration may be reversed.

In FIGS. 4b and 4c, the dimensions of one embodiment of the heat exchanger are separately labeled. The dimensions that follow are one example for an embodiment of the present invention that may be used in a notebook computing device. In one embodiment, the fan 405 is approximately a0.3 to 0.4 watt fan, and the heat exchanger outlet (or inlet) airflow is at least approximately 0.5 cubic feet per minute. Many other sizes, shapes, and fan power levels for such heat exchangers are also within the scope of the present invention.

EXEMPLARY EMBODIMENT

| Measurement Description | Figure | Ref. No. | Size (mm) |
|---|---|---|---|
| Housing Thickness (side) | 4c | 400a | .5 |
| Housing Width | 4b | 400b | 30 |
| Housing Length | 4b | 400c | 50 |
| Fin Length | 4b | 415a | 10–22 |
| Outlet Width (wide chamber end) | 4c | 435a | 22 |
| Inlet Width (narrow chamber end) | 4b | 430a | 13.5 |
| Housing Thickness (bottom) | 4c | 400d | .5 |
| Chamber Height | 4c | 400f | 7 |
| Housing Height | 4c | 400g | 8 |
| Fin Spacing (5 fins used) | 4c | 415a | 4 |
| Fin Thickness | 4c | 415 | .1 |

Figure 5A:
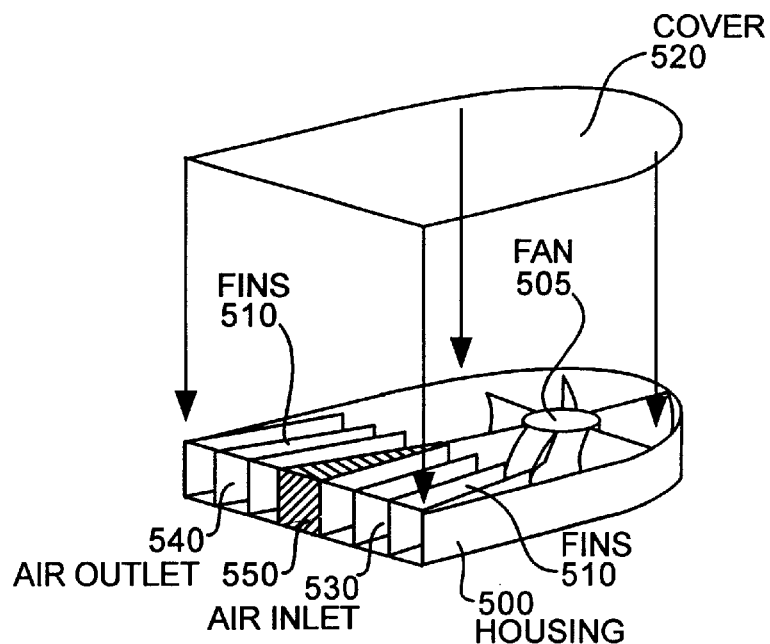
FIGS. 5a–5c illustrate one embodiment of a heat exchanger having a U-shaped chamber.
Figure 5B:
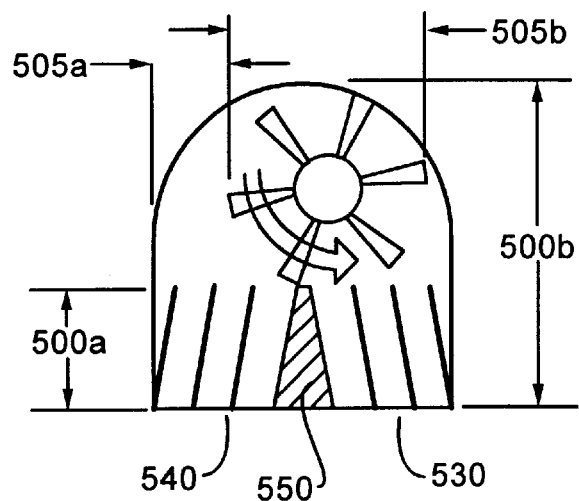
Figure 5C:
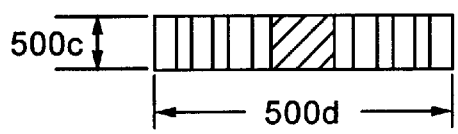

Another embodiment of a flat fan heat exchanger is shown in FIGS. 5a–5c. In this embodiment, a fan housing 500 forms a U-shaped chamber having a closed end portion containing a fan 505 and an open end. An inlet 530 and an outlet 540 are placed at the open end of the housing 500 and are separated by a divider 550. Additionally, fins 510 may be included to channel air in the chamber, and a cover 520 may seal the top of the chamber. A first set of fins extends from the inlet 530 towards the motor 505, and a second set of fins extends from the motor 505 towards the outlet 540.

In one embodiment, the fan 505 is offset towards the inlet 530 relative to a longitudinal center line of the housing (i.e., in FIG. 5b, a line bisecting the U-shape from top to bottom). Viewed from the top (as shown in FIG. 5b), with the inlet 530 on the right, the fan 505 rotates in a counter-clockwise direction. In other embodiments, the fan may be centered, or the inlet and outlet may be switched and the fan rotation reversed.

In FIGS. 5b and 5c, the dimensions of one embodiment of the U-shaped heat exchanger are separately labeled. The dimensions that follow are one example for an embodiment of the present invention that also may be used in a notebook computing device. Many other sizes, and shapes for U-shaped heat exchangers are also within the scope of the present invention.

EXEMPLARY EMBODIMENT

| Measurement Description | Figure | Ref. No. | Size (mm) |
|---|---|---|---|
| Finned Portion of Housing | 5b | 500a | 13 |
| Length of Housing | 5b | 500b | 35 |
| Height of Housing | 5c | 500c | 7 |
| Width of Housing | 5c | 500d | 30 |
| Outlet Housing Edge to Fan Blade | 5b | 505b | 7 |
| Fan Width | 5b | 505a | 20 |

Thus, the present invention provides a number of air flow heat exchanger solutions which may be used in a computing device such as a notebook computer. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A heat exchanger comprising:
   a fan housing defining a chamber, said chamber having a side inlet and a side outlet, said fan housing comprising a thermally conductive fan housing portion;
   a top closing surface for said chamber;
   a bottom closing surface for said chamber;
   a fan mounted within said chamber, said fan having a rotational axis substantially perpendicular to said bottom closing surface and substantially parallel to said side inlet and said side outlet; and
   a heat pipe having a first portion to thermally couple to an electronic component and a second portion thermally coupled to said thermally conductive fan housing portion.

2. The heat exchanger of claim 1 wherein said fan is operable to cause air inflow and air outflow in an airflow plane substantially parallel to said top closing surface and said bottom closing surface.

3. The heat exchanger of claim 1 wherein said fan housing is rectangular shaped and said side inlet is on a first side of said fan housing and said side outlet is on a second side of said fan housing which is opposite said first side.

4. The heat exchanger of claim 1 wherein said top closing surface fully covers said chamber.

5. The heat exchanger of claim 1 wherein said top closing surface is a removable cover.

6. A computing device comprising:
   a computer housing;
   an electronic component disposed within the computer housing; and
   a heat exchanger disposed within said computer housing, said heat exchanger being a remote heat exchanger that is located separately from the electronic component, said remote heat exchanger comprising a horizontally mounted fan, said horizontally mounted fan being configured to provide air inflow and air outflow through a fan chamber in a direction substantially perpendicular to an axis of rotation of the horizontally mounted fan, the heat exchanger further comprising a fan housing attached to said computer housing, said fan housing defining said fan chamber and an airflow plane substantially perpendicular to a rotational axis of said horizontally mounted fan, said fan housing having an inlet and an outlet, said inlet and said outlet being configured to allow airflow through said fan chamber in said airflow plane, said fan chamber surrounding said horizontally mounted fan wherein said fan housing forms a rectangular shape having an airflow axis running from said inlet to said outlet and a perpendicular axis perpendicular to said airflow axis, and wherein said horizontally mounted fan is mounted offset from a center point of said perpendicular axis.

7. The computing device of claim 6 wherein said fan housing comprises a thermally conductive fan housing portion, and wherein said computing device further comprises a heat pipe having a first portion thermally coupled to said electronic component and a second portion thermally coupled to said thermally conductive fan housing portion.

8. The computing device of claim 7 wherein said computing device further comprises a heat spreader plate thermally coupled to a third portion of said heat pipe.

9. The computing device of claim 6 further comprising:
a housing inlet in a first side of said computer housing, said housing inlet configured to provide air to an inlet portion of said fan housing;
a housing outlet in a second side of said computer housing, said housing outlet being configured to vent air from said horizontally mounted fan.

10. An apparatus comprising:
a computer housing;
an electronic component disposed within said computer housing;
a heat exchanger comprising:
a fan housing defining a chamber, said chamber having a side inlet and a side outlet, said fan housing comprising a thermally conductive fan housing portion;
a top closing surface for said chamber;
a bottom closing surface for said chamber;
a fan mounted within said chamber, said fan having a rotational axis subtantially perpendicular to said bottom closing surface and substantially parallel to said side inlet and said side outlet; and
a heat pipe having a first portion to thermally couple to said electronic component and a second portion thermally coupled to said thermally conductive fan housing portion.

11. The apparatus of claim 10 further comprising a heat spreader plate thermally coupled to said heat pipe.

* * * * *